United States Patent
Nishioka

(10) Patent No.: US 6,756,630 B2
(45) Date of Patent: Jun. 29, 2004

(54) NONVOLATILE SEMICONDUCTOR MEMORY DEVICE

(75) Inventor: Naho Nishioka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/096,487

(22) Filed: Mar. 13, 2002

(65) Prior Publication Data

US 2003/0011024 A1 Jan. 16, 2003

(30) Foreign Application Priority Data

Jul. 13, 2001 (JP) ........................................ 2001-213320

(51) Int. Cl.$^7$ ........................ H01L 29/788; H01L 29/76
(52) U.S. Cl. ........................ 257/315; 257/316; 257/314
(58) Field of Search ............................... 257/315, 491, 257/557, 511, 316, 314

(56) References Cited

U.S. PATENT DOCUMENTS 6,417,086 B1 * 7/2002 Osari ........................ 438/594

FOREIGN PATENT DOCUMENTS

| JP | 63-102366 | 5/1988 |
|---|---|---|
| JP | 11-111856 | 4/1999 |

OTHER PUBLICATIONS

E. Sun, et al "Breakdown Mechanism in Short–Channel MOS Transistors" IEEE Technical Digest 1, International Electron Devices Meeting, 1978, pp. 478–482.

* cited by examiner

*Primary Examiner*—Amir Zarabian
*Assistant Examiner*—Kiesha Rose
(74) *Attorney, Agent, or Firm*—McDermott, Will & Emery

(57) ABSTRACT

A nonvolatile semiconductor memory device includes a semiconductor substrate having a main surface and a plurality of transistors formed on the main surface. The transistors each include a gate electrode, a diffusion layer formed adjacent to the gate electrode and contacts communicating with the diffusion layer. The contacts corresponding to the transistors include a contact having a first distance from the gate electrode and a contact having a second distance from the gate electrode that is longer than the first distance.

2 Claims, 22 Drawing Sheets

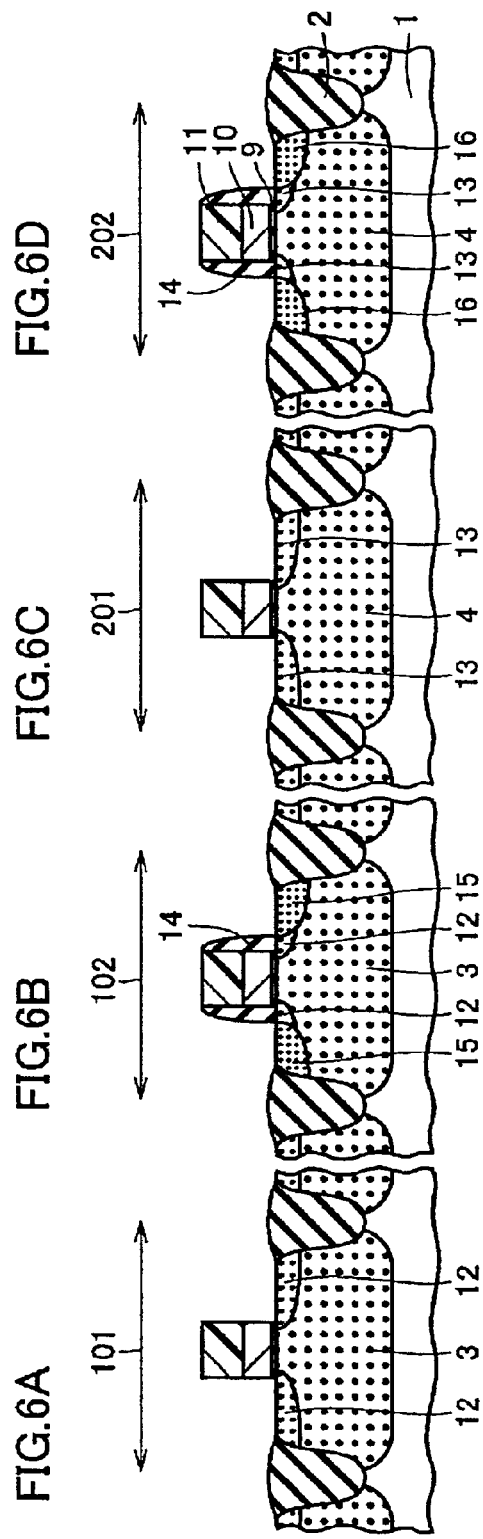

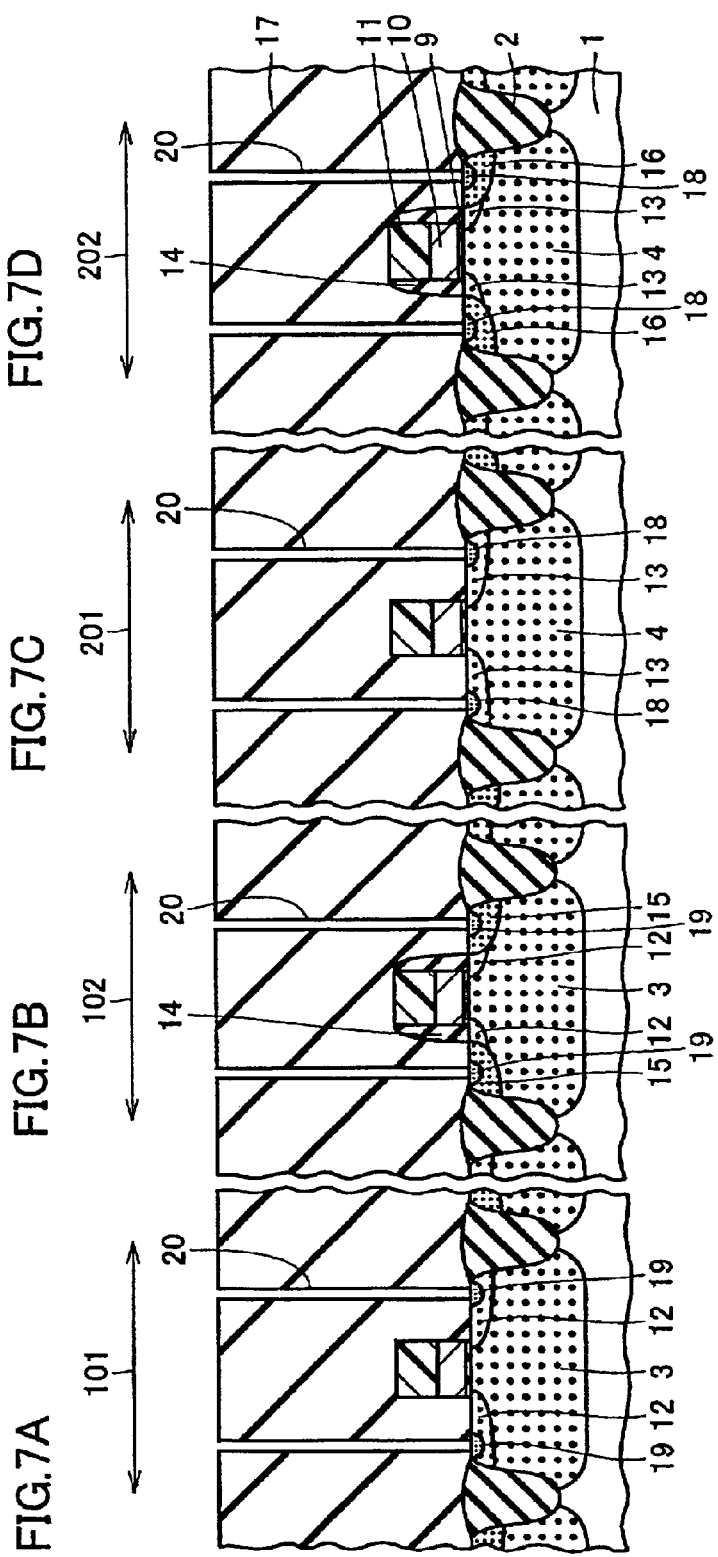

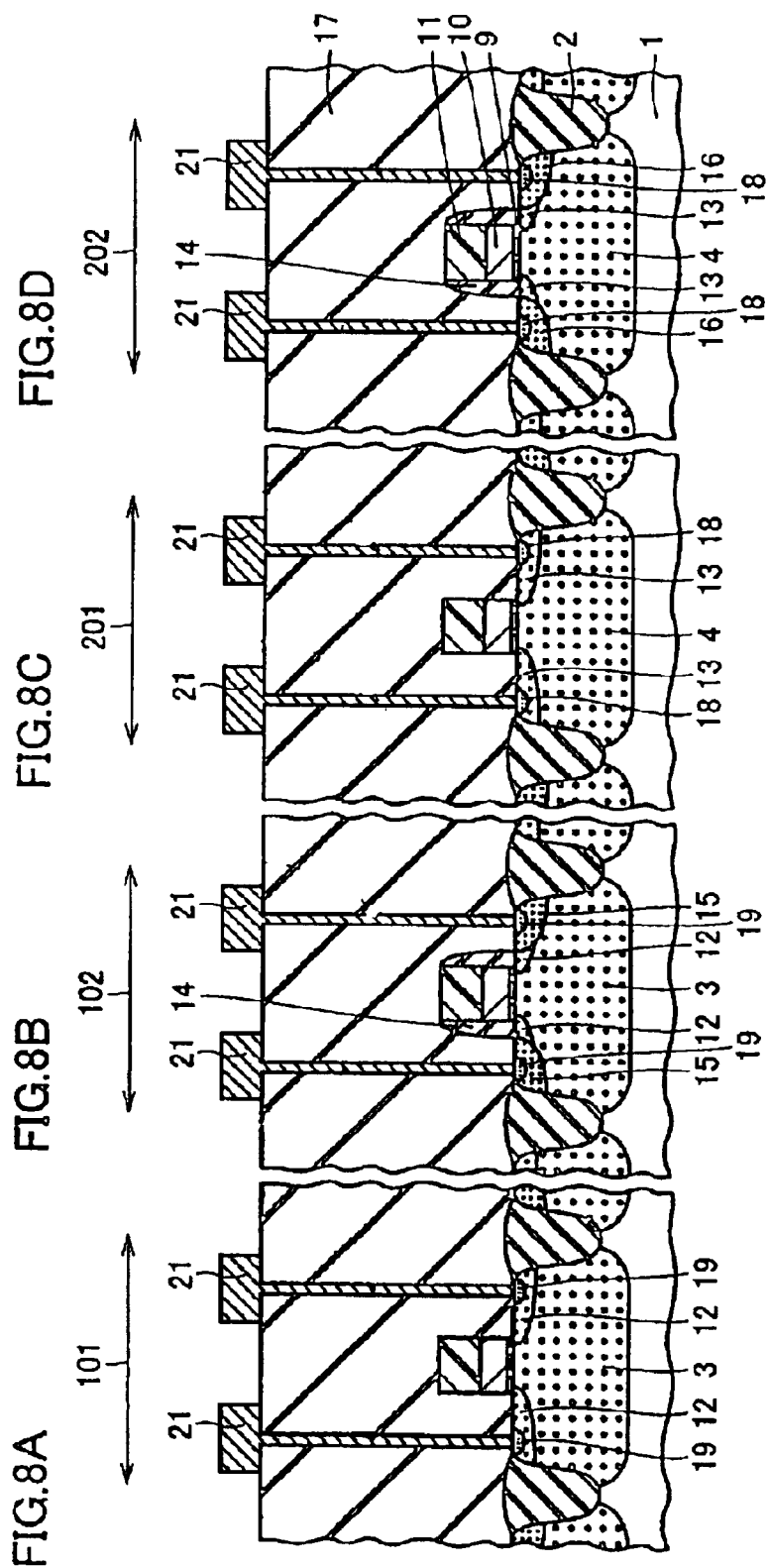

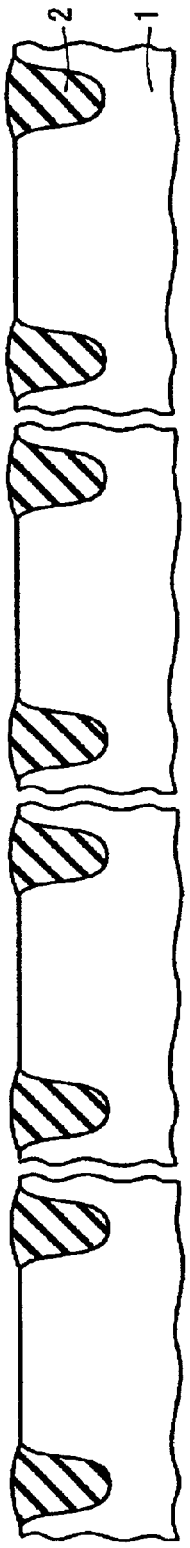

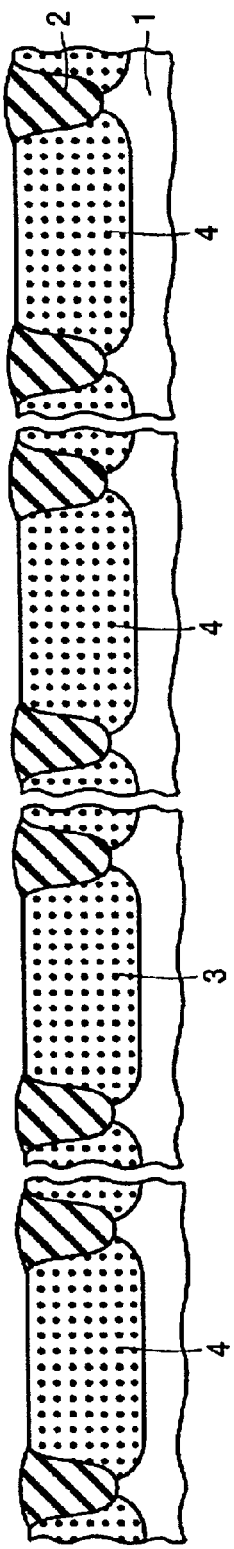

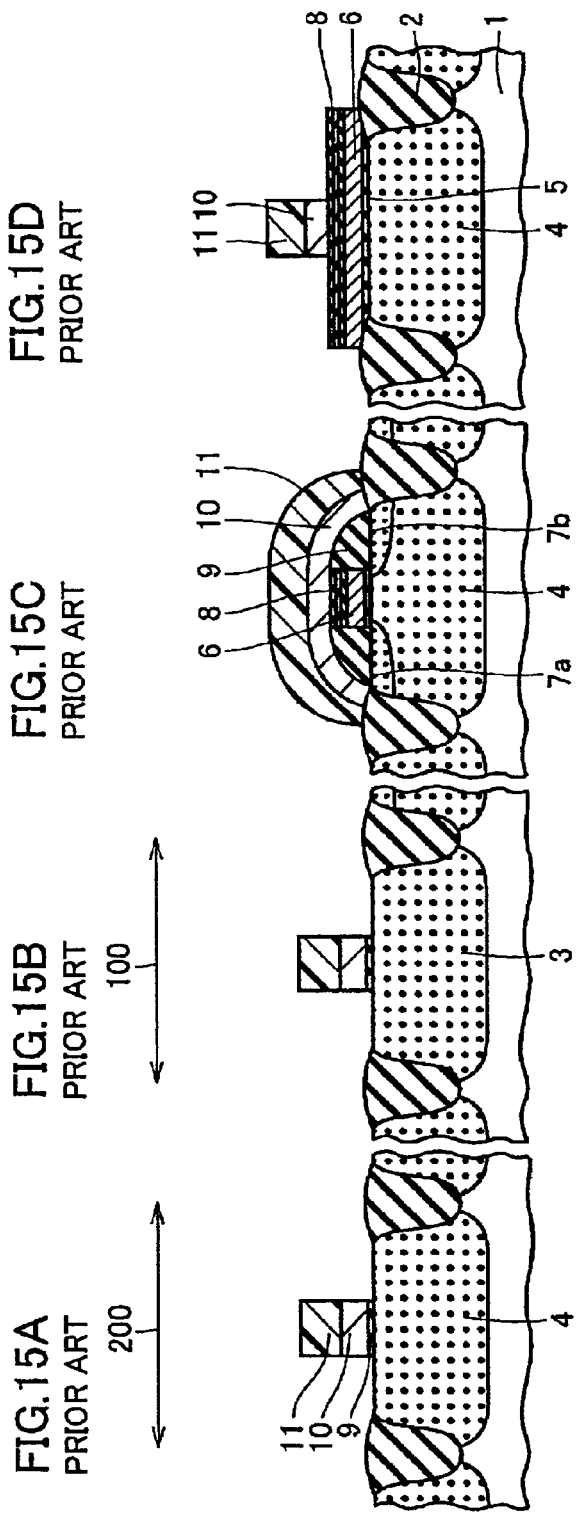

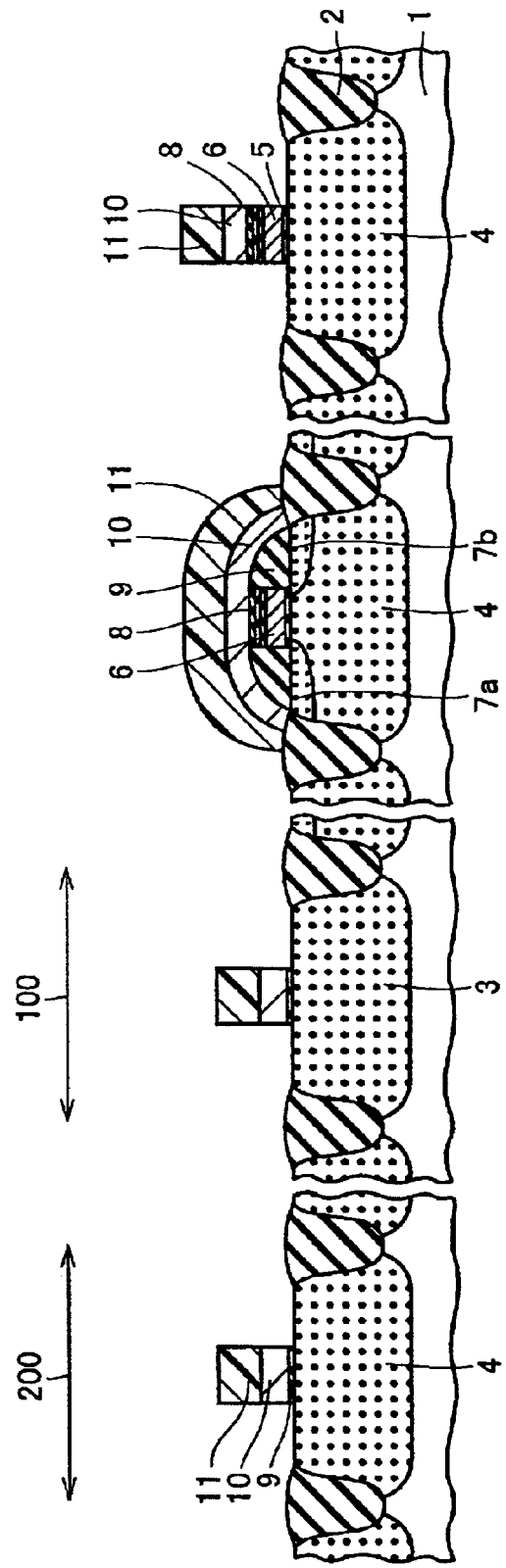

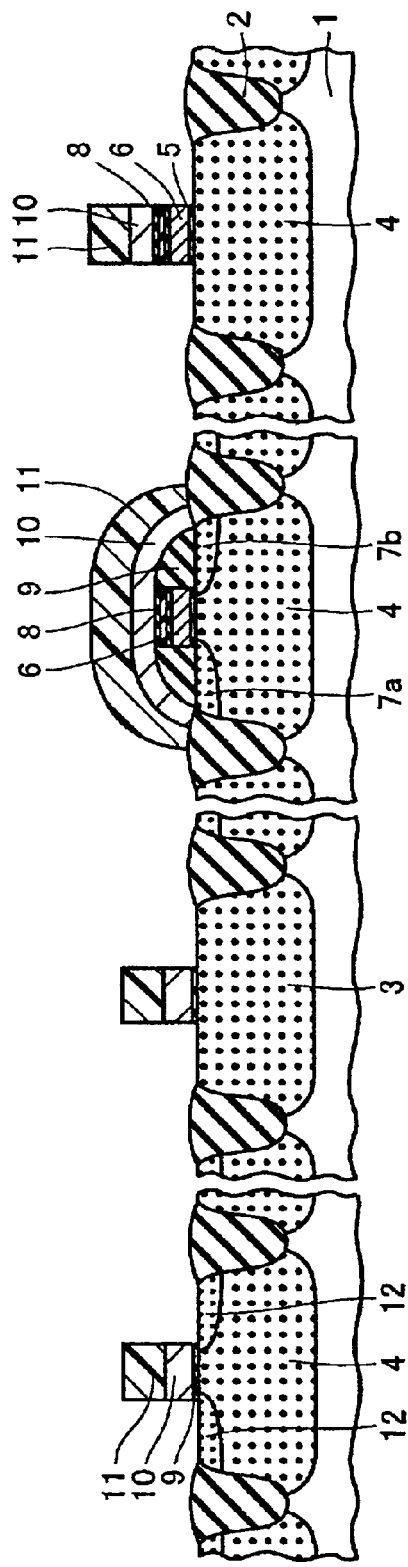

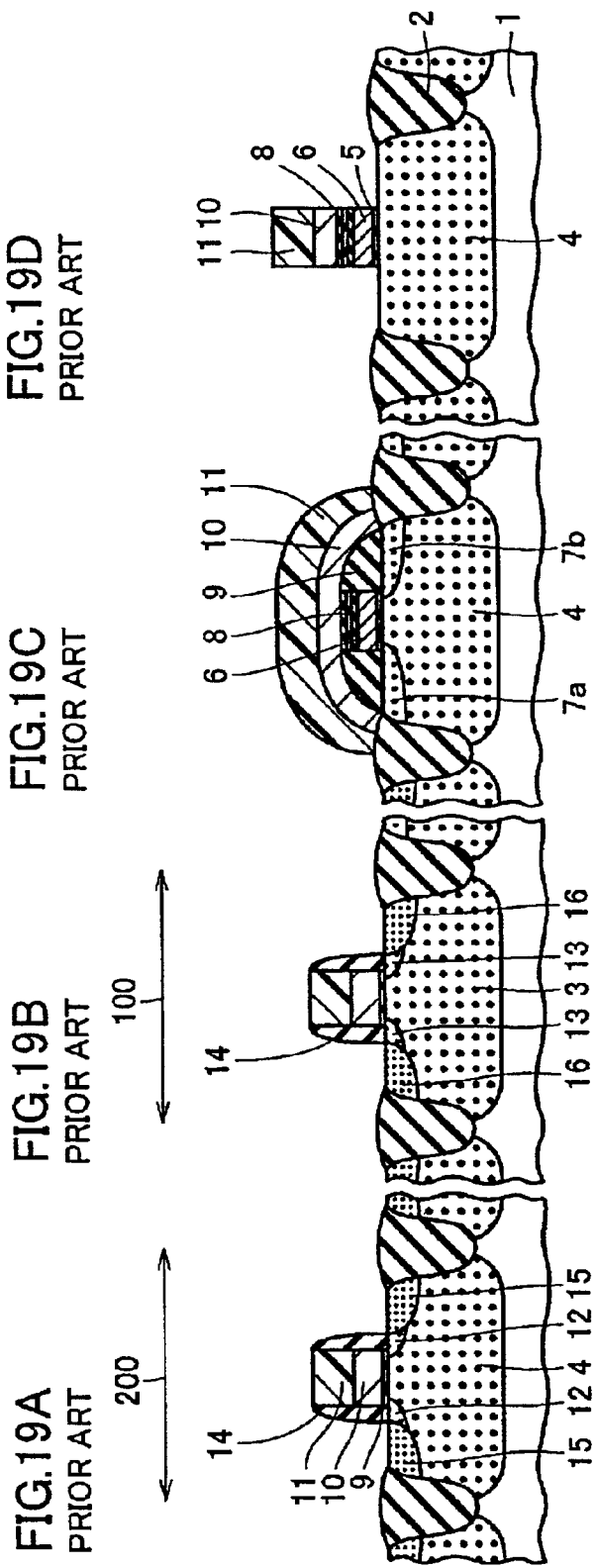

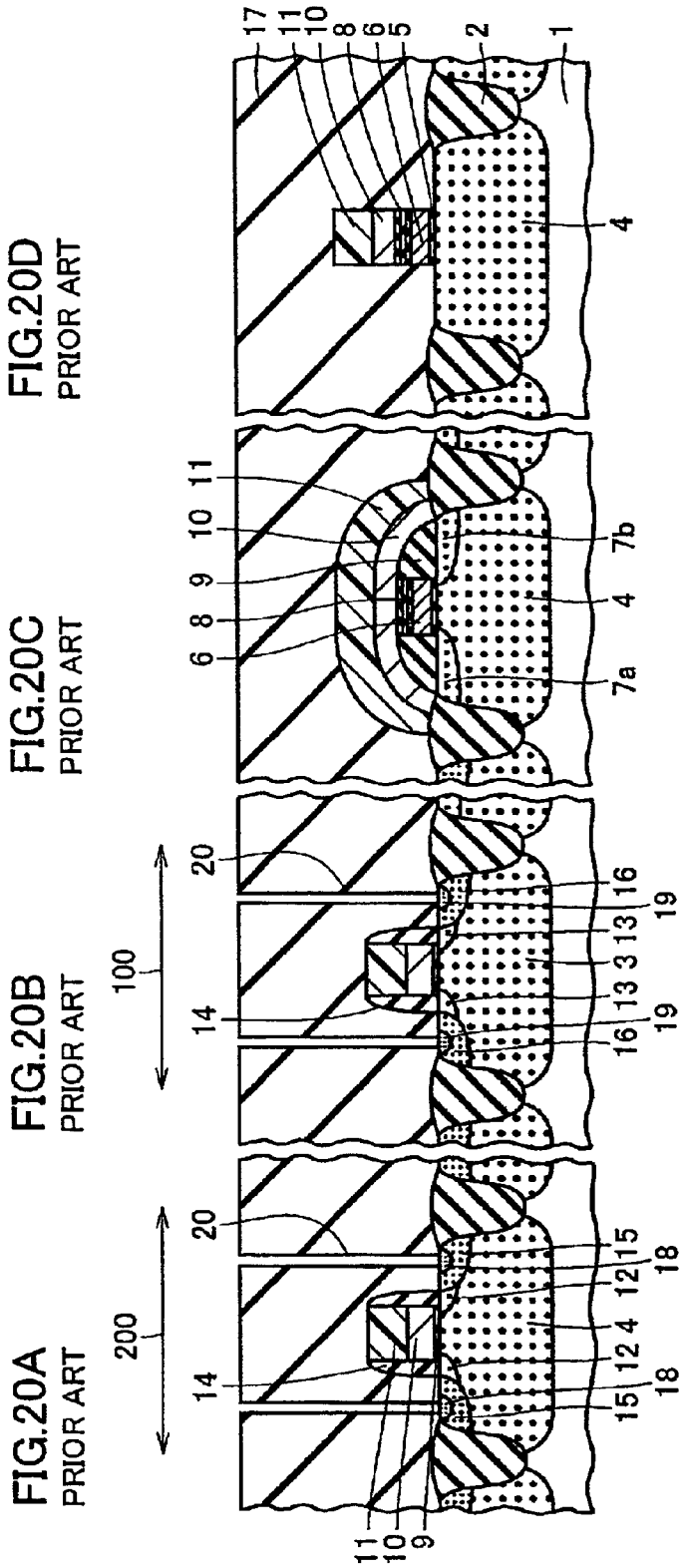

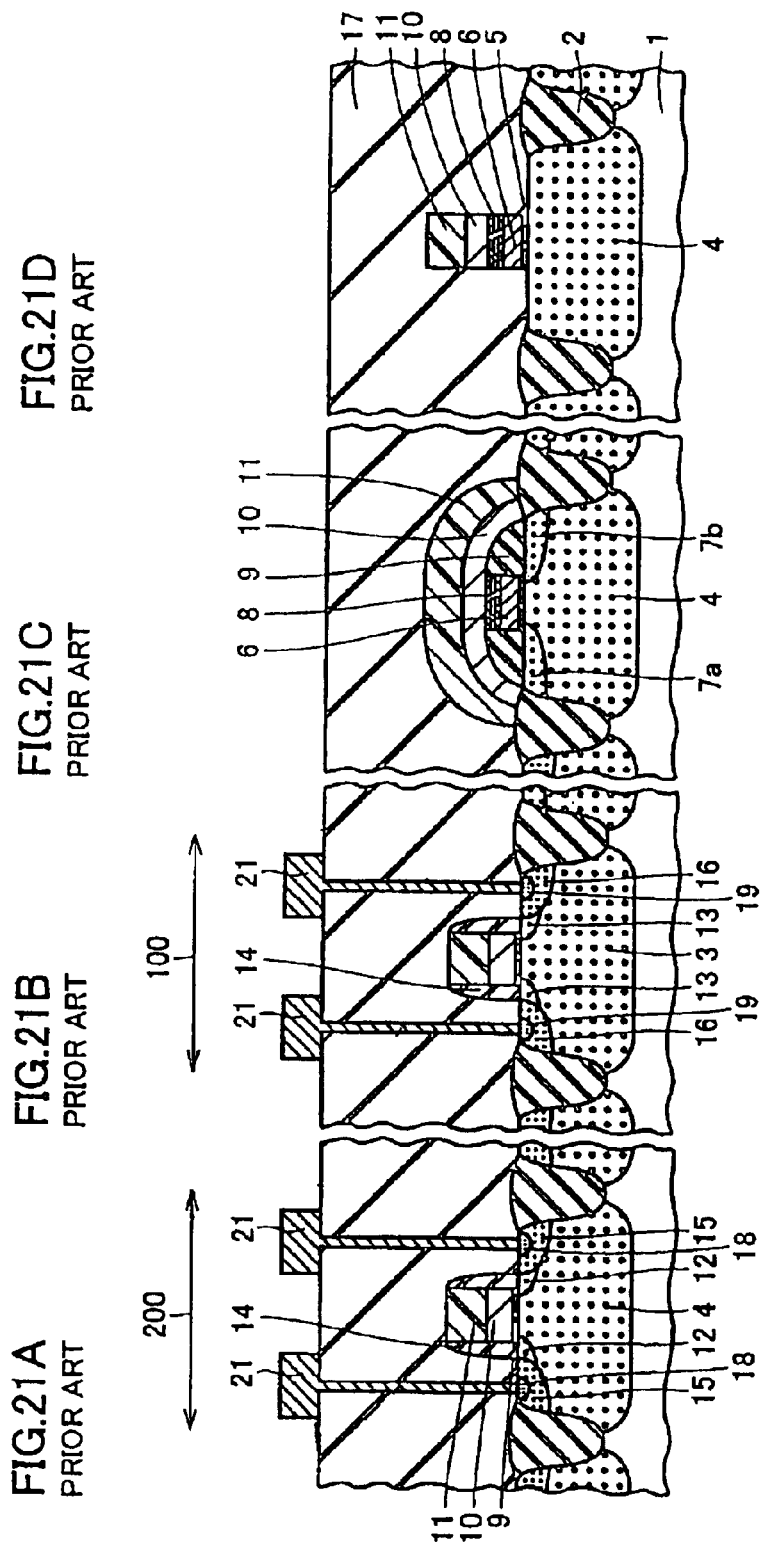

NONVOLATILE SEMICONDUCTOR MEMORY DEVICE

BACKGROUND OF THE INVENTION

1. Field of the Invention

The present invention relates to nonvolatile semiconductor memory devices and manufacturing methods thereof.

2. Description of the Background Art

A nonvolatile semiconductor memory device according to a conventional art and a method of manufacturing the nonvolatile semiconductor memory device are described below in conjunction with FIGS. 9A–9D to FIGS. 21A–21D and FIGS. 22–24. The nonvolatile semiconductor memory device includes two regions, i.e., a memory cell region and a peripheral circuitry region. In FIGS. 9A–9D to FIGS. 21A–21D, "A" and "B" (e.g. FIGS. 9A and 9B, 10A and 10B . . . ) represent the peripheral circuitry region and "C" and "D" (e.g. FIGS. 9C and 9D, 10C and 10D . . . ) represent the memory cell region. Further, "A" (e.g. FIGS. 9A, 10A . . . ) represents an NMOS transistor region 200 and "B" (e.g. FIGS. 9B, 10B . . . ) represents a PMOS transistor region 100 that are included in the peripheral circuitry region. A cross section in parallel with word lines of the memory cell region is represented by "C" (shown in FIGS. 9C, 10C . . . ) and a cross section in parallel with bit lines thereof is represented by "D" (shown in FIGS. 9D, 10D . . . ).

Referring to FIGS. 9A–9D, an isolation oxide film 2 is formed at a main surface of a silicon substrate 1. A resist (not shown) is formed on the entire main surface of silicon substrate 1. A part of the resist that is formed on PMOS transistor region 100 is removed. The remaining resist is used as a mask to carry out ion implantation under the conditions of 1.2 MeV and $1.0 \times 10^{13}$ cm$^{-2}$, for example, for implanting phosphorus as impurities and thus form an N well 3. Further, phosphorus ions are implanted for channel cutting of isolation oxide film 2 under the conditions of 700 keV and $3.0 \times 10^{12}$ cm$^{-2}$ for example, and boron ions are implanted for channel doping of the surface layer under the conditions of 20 keV and $1.5 \times 10^{12}$ cm$^{-2}$ for example. The resist is then removed to obtain N well 3 in PMOS transistor region 100 as shown in FIGS. 10A–10D.

A resist (not shown) is formed on the entire main surface of silicon substrate 1. A part of the resist that is formed on NMOS transistor region 200 and the memory cell region is removed. The remaining resist is used as a mask to carry out ion implantation under the conditions of 700 keV and $1.0 \times 10^{13}$ cm$^{-2}$, for example, for implanting boron as impurities and thus form a P well 4. Further, boron ions are implanted for channel cutting of isolation oxide film 2 under the conditions of 270 keV and $3.5 \times 10^{12}$ cm$^{-2}$ for example, and boron ions are also implanted for channel doping of the surface layer under the conditions of 50 keV and $1.2 \times 10^{12}$ cm$^{-2}$ for example. The resist is thereafter removed to obtain P well 4 in NMOS transistor region 200 and the memory cell region as shown in FIGS. 11A–11D.

On the entire exposed part of the main surface of silicon substrate 1, a silicon oxide film 5 is formed to a thickness of 100 Å by thermal oxidation. Silicon oxide film 5 is to be used as a tunnel oxide film. A phosphorus-doped polycrystalline silicon layer 6 is further formed to cover the upper side of silicon oxide film 5 to a thickness of 1000 Å by low-pressure CVD (Chemical Vapor Deposition) for the polycrystalline silicon film. By means of photolithography, a predetermined patterning process is conducted to etch phosphorus-doped polycrystalline silicon layer 6 of the memory cell region. After this etching, silicon oxide film 5 and phosphorus-doped polycrystalline silicon layer 6 of the peripheral circuitry region are left as they are. Then, by means of ion implantation, arsenic ions are implanted under the conditions of 40 keV and $2 \times 10^{15}$ cm$^{-2}$ for example to form n-type diffusion layers 7a and 7b in the memory cell region. In this way, the structure as shown in FIGS. 12A–12D is completed.

A silicon oxide film of 50 Å in thickness by thermal oxidation, a silicon nitride film of 100 Å in thickness by low-pressure CVD and a silicon oxide film of 50 Å in thickness by low-pressure CVD are formed in this order and accordingly, a three-layer insulating film 8 (also referred to as "ONO film") is produced. The structure as shown in FIGS. 13A–13D is thus completed.

By means of photolithography, a resist is formed to partially cover the memory cell region, and three-layer insulating film 8, phosphorus-doped polycrystalline silicon layer 6 and silicon oxide film 5 in the peripheral circuitry region are removed. Then, the structure as shown in FIGS. 14A–14D is completed.

Thermal oxidation is used to grow a silicon oxide film 9 to a thickness of 150 Å, that is to be used as a gate electrode of a transistor of the peripheral circuitry region. In the memory cell region at this stage, the silicon nitride film of three-layer insulating film 8 prevents underlying phosphorus-doped polycrystalline silicon layer 6 from being thermally oxidized. Then, by means of low-pressure CVD, a phosphorus-doped polycrystalline silicon layer 10 of 2000 Å in thickness and a silicon oxide film 11 of 2000 Å in thickness are deposited. A resist with a desired pattern is formed by photolithography, and this resist is used as a mask to pattern silicon oxide film 11. After removal of this resist, silicon oxide film 11 is used as a mask to pattern phosphorus-doped polycrystalline silicon layer 10 that is to be used as a gate electrode of a transistor of the peripheral circuitry region. Simultaneously, phosphorous-doped polycrystalline silicon layer 10 is also patterned that is to be used as a control electrode of a transistor of the memory cell region. In this way, the structure as shown in FIGS. 15A–15D is completed.

A resist is formed to cover the peripheral circuitry region, and silicon oxide film 11 of the memory cell region is used as a mask to etch three-layer insulating film 8 and phosphorus-doped polycrystalline silicon layer 6 and accordingly form a floating gate electrode of a transistor of the memory cell region. The structure as shown in FIGS. 16A–16D is accordingly completed.

A resist is further formed by photolithography to cover PMOS transistor region 100 and the memory cell region. The resist is used as a mask to implant phosphorus ions of $2 \times 10^{13}$ cm$^{-2}$ with 70 keV energy. Consequently, a low-concentration n-type diffusion layer 12 of an N channel transistor is formed in NMOS transistor region 200. The resist is thereafter removed and the structure as shown in FIGS. 17A–17D is completed.

By photolithography, a resist is formed to cover NMOS transistor region 200 and the memory cell region. The resist is used as a mask to implant BF$_2$ ions of $7 \times 10^{12}$ cm$^{-2}$ with 70 keV energy. As a result, a low-concentration p-type diffusion layer 13 of a P channel transistor is formed in PMOS transistor region 100. The resist is then removed and the structure as shown in FIGS. 18A–18D is completed.

By CVD, a silicon oxide film is deposited to a thickness of 2000 Å. Anisotropic etching of this silicon oxide film produces a sidewall spacer 14. By photolithography, a resist is formed to cover PMOS transistor region 100 and the memory cell region. This resist is used as a mask to implant arsenic ions of $3 \times 10^{15}$ cm$^{-2}$ with 50 keV energy. The resist is then removed. By photolithography again, a resist is formed to cover NMOS transistor region 200 and the memory cell region. The resist is used as a mask to implant BF$_2$ ions of $3 \times 10^{15}$ cm$^{-2}$ with 30 keV energy. The resist is removed and thus the structure shown in FIGS. 19A–19D is completed. In this structure, a high-concentration n-type diffusion layer 15 of the N channel transistor and a high-concentration p-type diffusion layer 16 of the P channel transistor are formed.

By CVD, a boron-phosphorus glass 17 is deposited to a thickness of 10000 Å. By annealing in a nitrogen atmosphere at 850° C. for 30 minutes, the boron-phosphorus glass is hardened or annealed and thereafter a resist with a desired pattern is formed by photolithography. This resist is used as a mask to etch the boron-phosphorus glass and accordingly make a contact hole 20.

By photolithography, a resist is formed to cover NMOS transistor region 200 and the memory cell region. Then, boron of $1 \times 10^{15}$ cm$^{-2}$ is implanted with 50 keV energy for generating an ohmic contact. The resist is then removed. By photolithography again, a resist is formed to cover PMOS transistor region 100, phosphorus of $1 \times 10^{15}$ cm$^{-2}$ is implanted with 70 keV energy for generating an ohmic contact and then the resist is removed. In this way, the structure shown in FIGS. 20A–20D is completed.

By sputtering, an aluminum-silicon-copper (Al—Si—Cu) alloy film is deposited. By photolithography, a resist with a desired pattern is formed, and this resist is used as a mask to etch the Al—Si—Cu alloy film. An Al—Si—Cu interconnect 21 is accordingly formed as shown in FIGS. 21A–21D.

The nonvolatile semiconductor memory device is thus produced.

A memory transistor of the nonvolatile semiconductor memory device is usually operated as described below. For programming (writing) of the memory transistor, a high voltage of approximately 20 V is usually applied to control gate electrode 10 to ground n-type diffusion layers 7a and 7b and silicon substrate 1. Accordingly, electrons are generated in a channel formed in the region between n-type diffusion layers 7a and 7b. The electrons tunnel through an energy barrier formed by tunnel oxide film 5 to enter floating gate electrode 6. As a result, the threshold voltage of a memory cell increases to $V_{thp}$.

On the contrary, for erasing, a high voltage (usually about −20V) is applied to control gate electrode 10 to ground n-type diffusion layers 7a and 7b and silicon substrate 1, and a resultant tunnel phenomenon causes electrons to be discharged from floating gate electrode 6 into silicon substrate 1. Consequently, the threshold voltage of the memory cell decreases to $V_{the}$.

For reading of a selected memory transistor, 3.3 V is applied to control gate electrode 10 and 3.3 V is also applied to n-type diffusion layer 7a which is drain, for example, so as to ground n-type diffusion layer 7b which is source and silicon substrate 1. Here, it is supposed that there exists a relation $V_{thp} > 3.3$ V $> V_{the}$. Then, no current flows between the source and drain of the memory transistor in a programmed state and current flows therebetween of the memory transistor in an erased state.

For a memory transistor which is not selected for reading, control gate electrode 10 is grounded, and 3.3 V is applied to n-type diffusion layer 7a which is the drain to ground n-type diffusion layer 7b which is the source and silicon substrate 1. As a relation $V_{thp} > V_{the} > 0$ is established, no current flows between the source and drain of the memory transistor when zero voltage is applied to control gate electrode 10.

Accordingly, only a selected memory transistor in a programmed state among memory transistors, current flows between the source and drain and thus information of each memory cell is defected.

For the nonvolatile semiconductor memory device, high voltage is used for writing and erasing as described above. Then, a transistor of the peripheral circuitry region must have a structure resistant to such high voltage. According to the conventional art, an LDD (Lightly Doped Drain) structure as shown in FIGS. 21A and 21B is employed so as to constitute a high breakdown-voltage transistor.

Here, the high breakdown-voltage transistor is described. The breakdown voltage of transistors is generally classified into the one called "OFF breakdown voltage" and the one called "ON breakdown voltage." OFF breakdown voltage refers to a breakdown voltage between the source and drain when voltage of 0 V is applied to the gate electrode. ON breakdown voltage refers to the minimum breakdown voltage between the source and drain when the voltage applied to the gate electrode is varied.

When a transistor is operating, the breakdown voltage between the source and drain has a mechanism which is one type of parasitic bipolar effects as analyzed by E. Sun, J. Moll, J. Berger and B. Alders in "Breakdown Mechanism in Short-Channel MOS Transistors" (IEEE Tech. Dig., International Electron Device Meeting, Washington D.C., 1978, p.478). For a short-channel MOSFET, when a drain voltage is increased, an electric field in the channel direction remarkably increases in the vicinity of the drain so that an avalanche breakdown phenomenon arises. Accordingly, a great number of carriers, namely electron-hole pairs are generated. Holes of the generated electron-hole pairs flow to a p-type silicon substrate to constitute substrate current $I_{sub}$ and a part of the holes flows into an n-type source region. The hole current flowing into the n-type source region causes the voltage in the vicinity of the n-type source region to decrease so that the potential difference between the n-type source region and the p-type silicon substrate exceeds the built-in potential (potential barrier) of the pn junction between the source region and the substrate. Then, forward current begins to flow through the pn junction between the source and substrate. In other words, electrons flow from the n-type source region into the p-type silicon substrate so that a parasitic bipolar transistor operation formed of the source-substrate-drain occurs. Consequently, a breakdown phenomenon of the MOS transistor occurs. The breakdown phenomenon occurs under a condition as represented by the following formula for example:

$$I_H \cdot R_{sub} > V_{built-in}$$

where $I_H$ denotes current flowing into the source, $R_{sub}$ denotes resistance along a path through which holes flow between the substrate and source, and $V_{built-in}$ denotes built-in potential of the pn junction between the substrate and source.

It is accordingly found that, in order to improve the breakdown voltage of a transistor, i.e., in order to make the breakdown phenomenon less likely to occur, decrease of hole current $I_H$ generated due to the avalanche breakdown phenomenon is critical. Substrate current $I_{sub}$ consisting of the great majority of the generated hole current serves directly as a barometer of the avalanche breakdown phenomenon and also serves as an important parameter used for predicting hot carrier deterioration. The substrate current greatly depends on the maximum field intensity in the source-drain direction (hereinafter "channel direction") in the vicinity of the drain and generally represented by the following formula:

$$I_{sub} \propto I_d \cdot E_m$$

where $I_d$ denotes drain current and $E_m$ denotes the maximum field intensity in the channel direction. It is accordingly found that the maximum field intensity $E_m$ may be reduced for decreasing the substrate current (hole current).

Then, for a transistor having the LDD structure explained above, the maximum field intensity $E_m$ can be reduced by increasing the width of the low-concentration diffusion layer. Here, "width of low-concentration diffusion layer" refers to the width of the portion where the low-concentration diffusion layer is present along a current path in the source-drain direction. In this way, a depletion layer can be extended sufficiently into the low-concentration diffusion layer and thus the field intensity in the corresponding portion can be decreased. FIG. 22 shows a graph disclosed by Koyanagi, Kaneko and Shimizu in "Digest of 1983 Autumn Annual Meeting of the Japan Society of Applied Physics" indicating the field intensity at each position for several widths of the low-concentration diffusion layer. In this graph, $L_{sw}$ denotes the length of one side, in the channel direction, of the low-concentration diffusion layer. As seen from this graph, increase of the width of low-concentration diffusion layer in the channel direction provides enhancement of the breakdown-voltage property of a transistor.

The low-concentration diffusion layer has a relatively high resistance. Then, increase of the width of this region causes the drain current to decrease as shown in FIG. 23. This means that the transistor has a deteriorated current drivability which results in a lower reading speed for example. However, the deteriorated current drivability presents no problem since it takes a long time, in writing and erasing operations essentially requiring a high breakdown-voltage, to implant electrons into the floating gate and draw electrons from the floating gate.

SUMMARY OF THE INVENTION

One object of the present invention is accordingly to provide a nonvolatile semiconductor memory device satisfying requirements of both of a high breakdown-voltage transistor which needs no current-drive power and a transistor which needs no high-breakdown voltage while it requires the current-drive power. Another object of the present invention is to provide a method of manufacturing the nonvolatile semiconductor memory device which can form both of such transistors without addition of any extra process step to the conventional manufacturing method.

According to one aspect of the present invention, in order to achieve the objects above, a nonvolatile semiconductor memory device includes a semiconductor substrate having a main surface and a plurality of transistors formed on the main surface. The transistors each include a gate electrode, a diffusion layer formed adjacent to the gate electrode, and contacts communicating with the diffusion layer. The contacts corresponding to the transistors include contacts at a first distance from the gate electrode and contacts at a second distance, longer than the first distance, from the gate electrode. This structure can be used to implement transistors in which the distance between a contact and a gate electrode can be determined according to characteristics required of the transistors respectively and thus the transistors can meet various needs.

Preferably, according to the present invention, the transistors include a normal transistor having its interconnection for applying the normal transistor with only a voltage of at most a predetermined first level so as to operate the normal transistor, and a high breakdown-voltage transistor having its interconnection for applying the high breakdown-voltage transistor with a voltage of a second level higher than the first level. The contacts of the normal transistor are each at the first distance from the gate electrode, and the contacts of the high breakdown-voltage transistor include a contact at the second distance from the gate electrode. This structure can be used to make longer the gate-contact distance of the high breakdown-voltage transistor than that of the normal transistor. Then, the width of diffusion layer of the high breakdown-voltage transistor can be kept large in order to enhance the breakdown-voltage property of the high breakdown-voltage transistor.

Preferably, according to the present invention, the high breakdown-voltage transistor includes a transistor having the contacts located on two lateral sides of the transistor, and one of the contacts is at the first distance from the gate electrode and the other contact is at the second distance from the gate electrode. This structure can be used to allow a high breakdown-voltage transistor, which has source and drain never replaced with each other, to have a longer distance between the gate electrode and contact where the high breakdown-voltage is necessary. Then, the high breakdown-voltage can be achieved in only a portion requiring it.

According to another aspect of the present invention, in order to achieve the objects above, a nonvolatile semiconductor memory device includes a semiconductor substrate having a memory cell region and a peripheral circuitry region, a first transistor placed at the memory cell region and on the semiconductor substrate, and second and third transistors placed at the peripheral circuitry region and on the semiconductor substrate. The first transistor serves as a nonvolatile memory device capable of writing, erasing and reading information by being applied with a predetermined voltage. The second and third transistors each include a gate electrode formed on a main surface of the semiconductor substrate, a first pair of diffusion layers formed by implanting impurities with a first concentration into respective active regions adjacent to two lateral sides respectively of the gate electrode, an interlayer insulating film formed to cover the gate electrode and the first pair of diffusion layers, and paired contacts electrically connected respectively to the diffusion layers of the first pair of diffusion layers through the interlayer insulating film. The paired contacts include respective contact bodies extending upward from the main surface and respective contact-connected diffusion layers formed by implanting impurities with a second concentration higher than the first concentration locally into respective regions in the vicinity of respective contact regions between the contact bodies and the semiconductor substrate. The second transistor has its interconnection for applying the second transistor with only a voltage of at most a predetermined first level so as to operate the second transistor. The third transistor has its interconnection for applying the third transistor with a voltage of a second level higher than the first level when at least one of writing and reading of the first transistor is performed. A contact of the paired contacts of the third transistor that is applied with the voltage of the second level serves as a high breakdown-voltage contact, a contact except for the high breakdown-voltage contact of the second and third transistors serves as a normal contact, and the distance between the gate electrode and a corresponding contact-connected diffusion layer of the high breakdown-voltage contact is longer than the distance between the gate electrode and a corresponding contact-connected diffusion layer of the normal contact. This structure can be used to make longer the width of low-concentration diffusion layer corresponding to the first pair of diffusion layers in a high breakdown-voltage transistor region so that the maximum field intensity $E_m$ can be decreased in this region. Accordingly, the breakdown-voltage property can be improved. In a high drive-power transistor region, the width of low-concentration diffusion layer is smaller so that the drain current does not decrease and the operating speed can be kept high.

Preferably, according to the present invention, the contact-connected diffusion layers of the second and third transistors are each an impurity layer formed by implanting impurities through each contact hole for the paired contacts. The distance between the gate electrode and the high breakdown-voltage contact of the third transistor is longer than the distance between the gate electrode and the normal contact of the second and third transistors. This structure can be used to implant impurities through a contact hole to generate the contact-connected diffusion layer serving as a high-concentration diffusion layer of the conventional LDD structure. Then, no sidewall is necessary that is required for producing the conventional LDD structure. The manufacture is thus facilitated since just a change is necessary to the positions of contact holes in order to implement a high breakdown-voltage transistor.

Preferably, according to the present invention, the second transistor includes a sidewall spacer covering a sidewall of the gate electrode. The contact-connected diffusion layers of the second transistor are included in the first pair of diffusion layers, the contact-connected diffusion layers constituting a second pair of diffusion layers formed by implanting impurities into respective regions exposed on the main surface and located adjacent to the outside of the sidewall spacer. This structure can be used to produce the second pair of diffusion layers by implanting impurities with the sidewall as a mask, for the second transistor, namely the normal transistor, and thus produce the LDD structure. It is unnecessary to make a contact hole close to the gate electrode for preventing the drive current from decreasing. The thickness of the sidewall determines the width of low-concentration diffusion layer so that the drive current can be kept constant.

Preferably, according to the present invention, the contact-connected diffusion layers of the third transistor are each an impurity layer formed by implanting impurities through each contact hole for the paired contacts. The distance between the gate electrode and the high breakdown-voltage contact of the third transistor is longer than the distance between the gate electrode and the normal contact of the third transistor. This structure can be used to produce the second transistor with the LDD structure so as to allow the second transistor to have a constant drive current. The third transistor has the contact produced distantly from the gate electrode so that the width of low-concentration diffusion layer can be kept long and thus the breakdown-voltage property can be improved.

According to the present invention, in order to achieve the objects above, a method of manufacturing a nonvolatile semiconductor memory device including a plurality of transistors formed on a main surface of a semiconductor substrate, the plurality of transistors including a gate electrode and a diffusion layer formed adjacent to the gate electrode, and the transistors including a first group of transistors and a second group of transistors, the method including the step of forming contact holes of the first group of transistors at a first distance from the gate electrode and forming contact holes of the second group of transistors at a second distance, longer than the first distance, from the gate electrode. This method can be used to allow the first group of transistors to serve as normal transistors and allow the second group of transistors having a longer gate-contact distance to serve as high breakdown-voltage transistors. These normal and high breakdown-voltage transistors can accordingly be produced simultaneously through the same process steps.

Preferably, according to the present invention, the transistors of the first group are each serve as a normal transistor having its interconnection for applying the normal transistor with only a voltage of at most a predetermined first level so as to operate the normal transistor, and the transistors of the second group are each serve as a high breakdown-voltage transistor having its interconnection for applying the high breakdown-voltage transistor with a voltage of a second level higher than the first level. This method can be used to make longer the gate-contact distance and thus achieve a high breakdown-voltage in a transistor applied with a high voltage, since whether a transistor is a high breakdown-voltage transistor or not is determined depending on whether the transistor is applied with a high voltage of the second level.

Preferably, according to the present invention, at least a part of the transistors of the second group each includes the contact holes formed on two lateral sides of the transistor, one of the contact holes is formed at the first distance from the gate electrode and the other contact hole is formed at the second distance from the gate electrode. This method can be used to allow a transistor with only one side applied with a high-voltage to have a longer gate-contact distance where a high breakdown-voltage is required. Then, the high breakdown-voltage can be achieved for only a portion requiring it.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6A–6D illustrate the eleventh step of a method of manufacturing a nonvolatile semiconductor memory device according to a third embodiment of the present invention.

FIGS. 7A–7D illustrate the twelfth step of a method of manufacturing the nonvolatile semiconductor memory device according to the third embodiment of the present invention.

FIGS. 8A–8D illustrate the thirteenth step of a method of manufacturing the nonvolatile semiconductor memory device according to the third embodiment of the present invention.

FIGS. 9A–9D to FIGS. 21A–21D illustrate the first to thirteenth steps of a method of manufacturing a nonvolatile semiconductor memory device according to a conventional art.

DESCRIPTION OF THE PREFERRED EMBODIMENTS

First Embodiment

Figure 1:
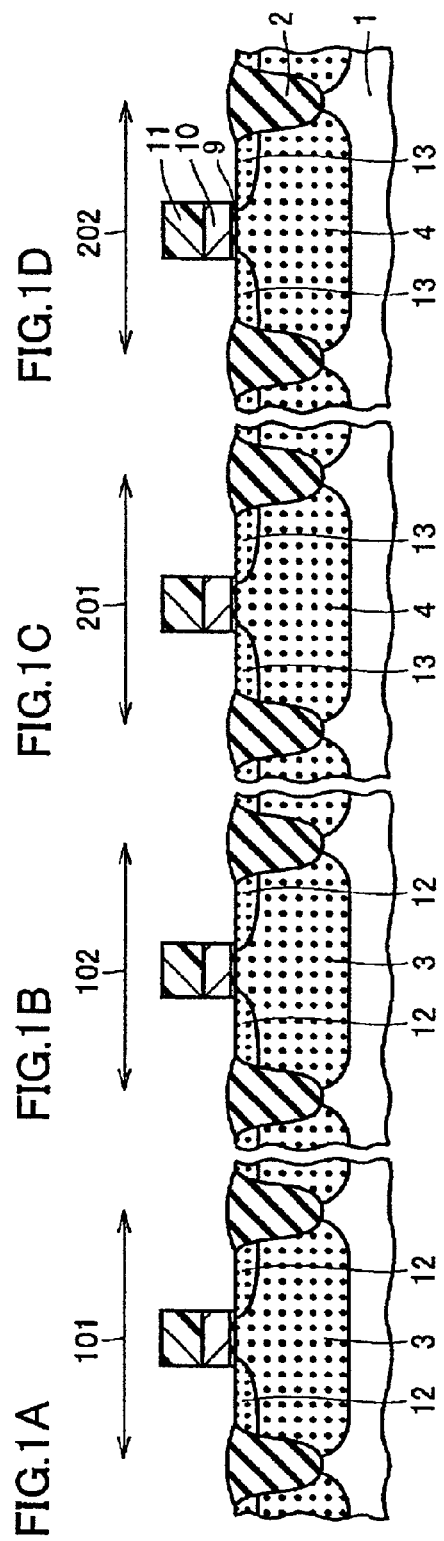
FIGS. 1A–1D illustrate tenth and eleventh process steps of a method of manufacturing a nonvolatile semiconductor memory device according to a first embodiment of the present invention.
Figure 2:
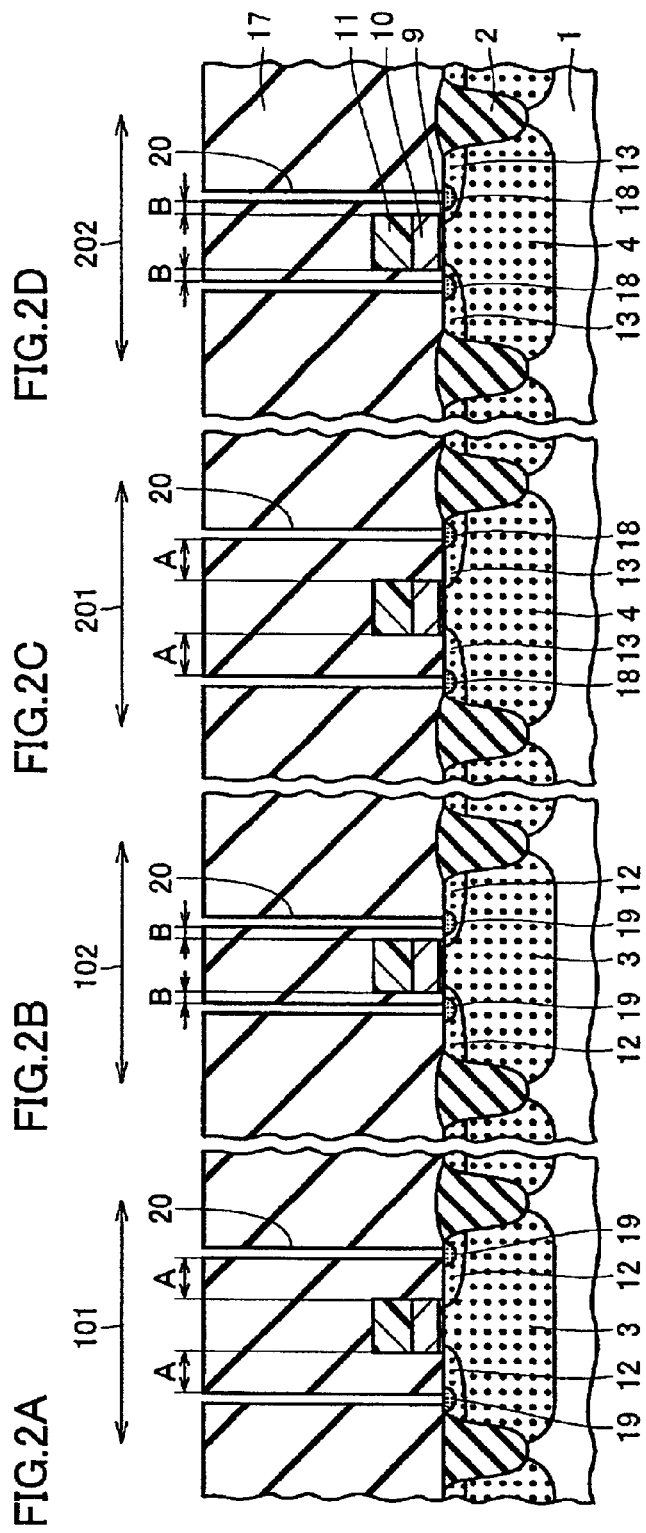
FIGS. 2A–2D illustrate the twelfth step of the method of manufacturing the nonvolatile semiconductor memory device according to the first embodiment of the present invention.
Figure 3:
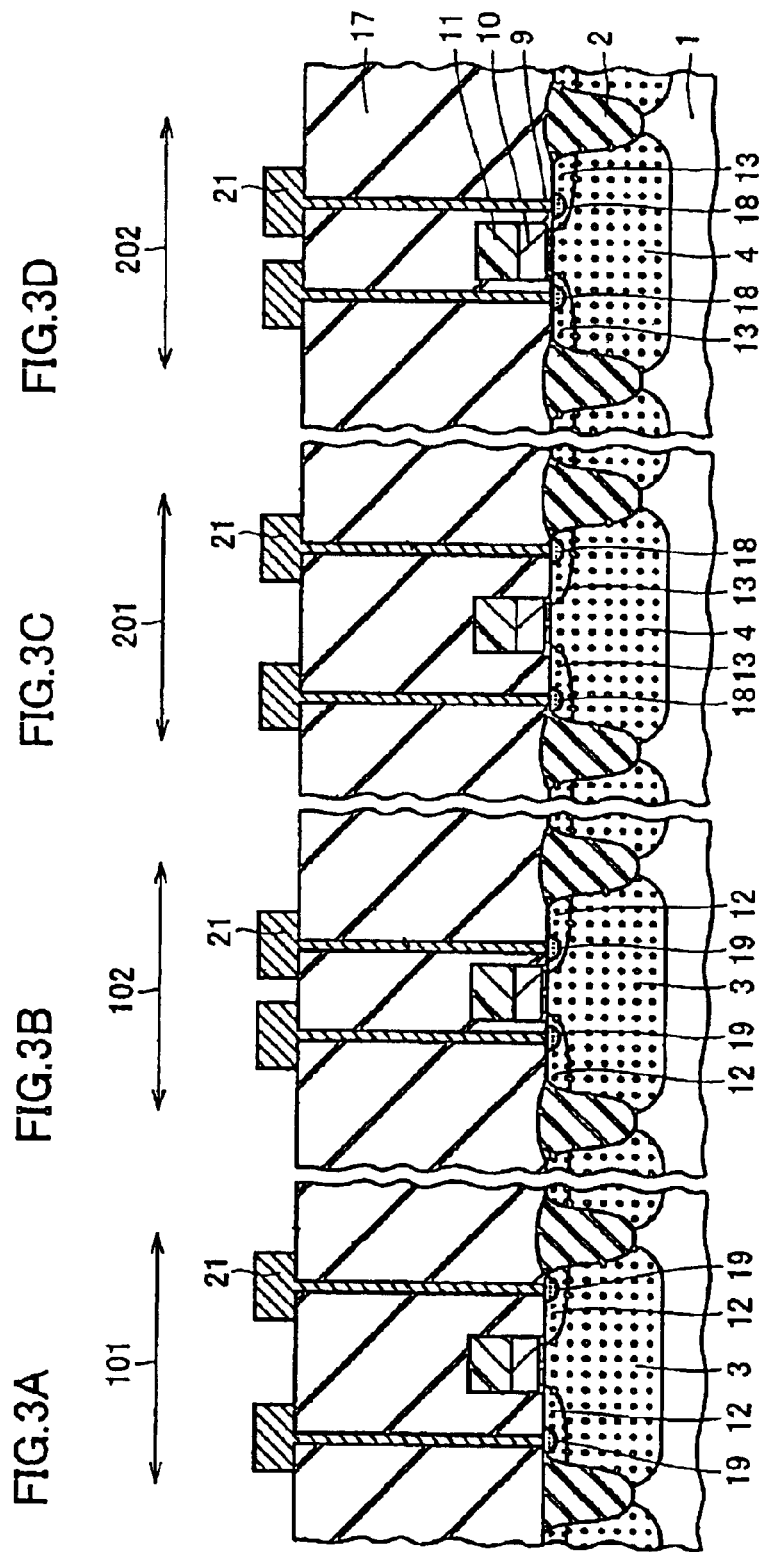
FIGS. 3A–3D illustrate the thirteenth step of the method of manufacturing the nonvolatile semiconductor memory device according to the first embodiment of the present invention.

A method of manufacturing a nonvolatile semiconductor memory device is described, in conjunction with FIGS. 1A–1D, 2A–2D and 3A–3D, according to a first embodiment of the present invention. According to this manufacturing method, the structure as shown in FIGS. 18A–18D is produced through the same process steps as those of the manufacturing method of the nonvolatile semiconductor memory device of the conventional art detailed above. Therefore, succeeding process steps are now described in order. FIGS. 1A–1D show a PMOS transistor region 100 and an NMOS transistor region 200 corresponding to the peripheral circuitry region shown in FIGS. 18A and 18B. It is noted that, in FIGS. 1A–1D, PMOS transistor region 100 is further classified into two regions, namely a high breakdown-voltage PMOS transistor region 101 and a high drive-power PMOS transistor region 102 depending on the type of transistor to be produced. The high drive-power transistor region refers to a region where a normal transistor requiring no high breakdown-voltage is to be formed. NMOS transistor region 200 is also classified into two regions, namely a high breakdown-voltage NMOS transistor region 201 and a high drive-power NMOS transistor region 202. Referring to FIGS. 1A–1D, high breakdown-voltage PMOS transistor region 101, high drive-power PMOS transistor region 102, high breakdown-voltage NMOS transistor region 201 and high drive-power NMOS transistor region 202 are shown side by side respectively in FIGS. 1A–1D.

Referring to FIGS. 2A–2D, CVD is used to deposit a boron-phosphorus glass 17 to a thickness of 10000 Å. By annealing in a nitrogen atmosphere at 850° C. for 30 minutes, the boron-phosphorus glass is hardened or annealed. After this, a resist is formed into a desired pattern by photolithography. The resist is used as a mask to etch the boron-phosphorus glass in order to produce contact holes 20 leading to a low-concentration p-type diffusion layer 13 and a low-concentration n-type diffusion layer 12 respectively. This process step is basically the same as that of the conventional method, however, the arrangement of contact holes 20 is different therebetween as specifically described below. Here, a phosphorus-doped polycrystalline silicon layer 10 serves as a gate electrode, and "gate-contact distance" is defined as the distance between an edge of the gate electrode that is closest to contact hole 20 and an edge of contact hole 20 that is closest to the gate electrode. The gate-contact distance (A) of high breakdown-voltage PMOS transistor region 101 and high breakdown-voltage NMOS transistor region 201 is greater than the gate-contact distance (B) of high drive-power PMOS transistor region 102 and high drive-power NMOS transistor region 202, namely there is a relation A>B as shown in FIGS. 2A–2D.

A resist is thereafter formed by photolithography to cover NMOS transistor region 200 and the memory cell region. The resist is used as a mask to implant boron ions under the conditions of 50 keV and $1.0 \times 10^{15}$ cm$^{-2}$. A contact-connected p-type diffusion layer 19 is thus formed. The resist is then removed. By photolithography again, a resist is formed to cover PMOS transistor region 100. The resist is used as a mask to implant phosphorus ions under the conditions of 50 keV and $1.0 \times 10^{15}$ cm$^{-2}$. A contact-connected n-type diffusion layer 18 is thus produced. The resist is removed and accordingly the structure shown in FIGS. 2A–2D is completed. At this stage, the memory cell region has the structure as shown in FIGS. 20C and 20D explained above in connection with the conventional art.

By sputtering, an aluminum-silicon-copper (Al—Si—Cu) alloy film is deposited. By photolithography, a resist is formed into a desired pattern that is used as a mask to etch the Al—Si—Cu alloy film. Accordingly, as shown in FIGS. 3A–3D, an Al—Si—Cu interconnect 21 is formed. At this stage, the memory cell region has the structure shown in FIGS. 21C and 21D described above in connection with the conventional art. The nonvolatile semiconductor memory device is completed in this way.

In the nonvolatile semiconductor memory device manufactured as discussed above, the gate-contact distances A and B have the relation A>B. This means that the width between one contact-connected diffusion layer and the other contact-connected diffusion layer, herein referred to as "width of low-concentration diffusion layer," of the high-breakdown voltage PMOS and NMOS transistors is greater than that of the high drive-power PMOS and NMOS transistors while these transistors are produced simultaneously through the same process steps.

Figure 22:
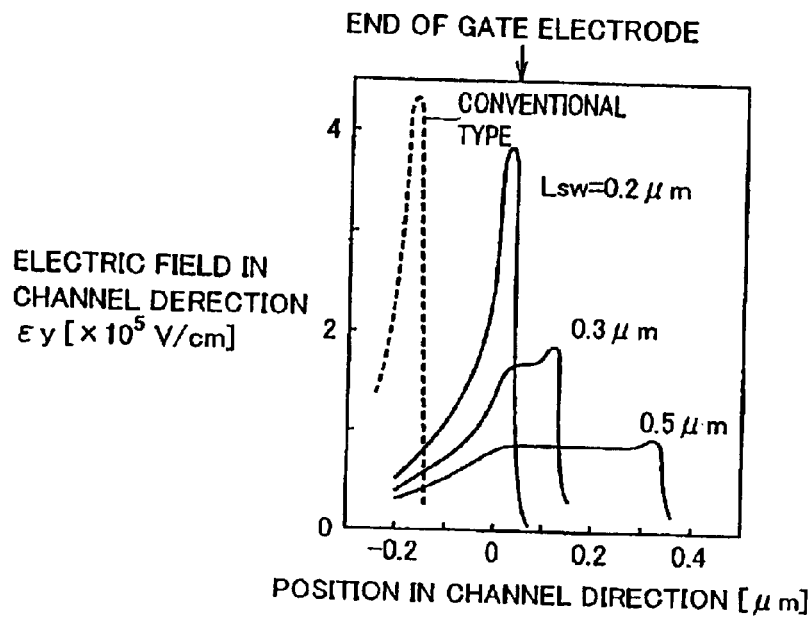
FIG. 22 is a graph showing the field intensity at each position in the channel direction where the width of low-concentration diffusion layer is varied.
Figure 23:
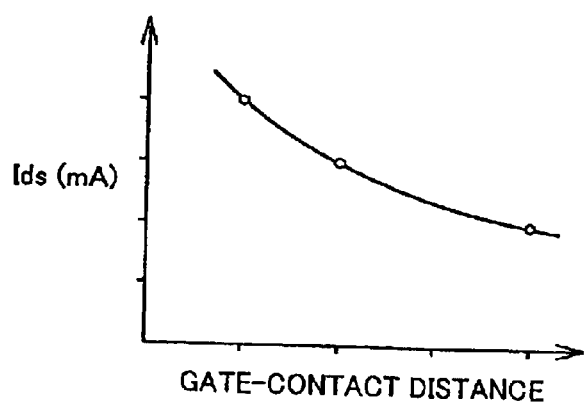
FIG. 23 is a graph illustrating a relation between the gate electrode-contact distance and drive current.
Figure 24:
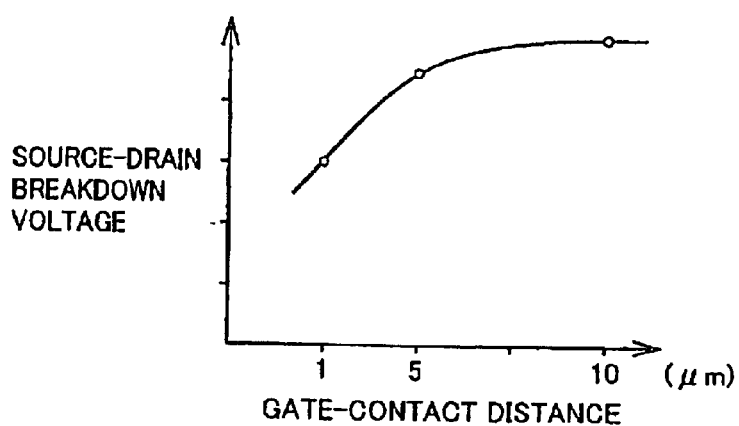
FIG. 24 is a graph illustrating a relation between the gate electrode-contact distance and breakdown voltage between the source and drain.

In the high breakdown-voltage transistor regions, the width of low-concentration diffusion layer is made greater so that the maximum field intensity $E_m$ can be decreased as discussed with reference to FIG. 22. Increase of the width of low-concentration diffusion layer, i.e., increase of the gate-contact distance, causes the drive current to decrease as shown in FIG. 23. However, enhancement of the breakdown-voltage property is simultaneously achieved. Therefore, the greater width of low-concentration diffusion layer of the high breakdown-voltage transistor regions allows the breakdown-voltage property of the transistors to improve. On the other hand, in the high drive-power transistor regions, the drain current does not decrease since the width of low-concentration diffusion layer is kept short. Then, a great drive-power, namely a high operating-speed can be maintained.

Moreover, according to the present invention, both of the high breakdown-voltage and high drive-power transistors can be manufactured simultaneously through the same process steps and thus require no additional process step. It is merely necessary to change a mask pattern for producing contact holes.

Second Embodiment

Figure 4:
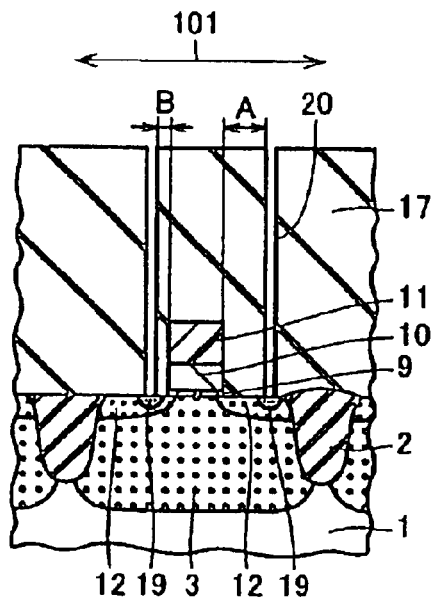
FIG. 4 illustrates the twelfth step of a method of manufacturing a nonvolatile semiconductor memory device according to a second embodiment of the present invention.
Figure 5:
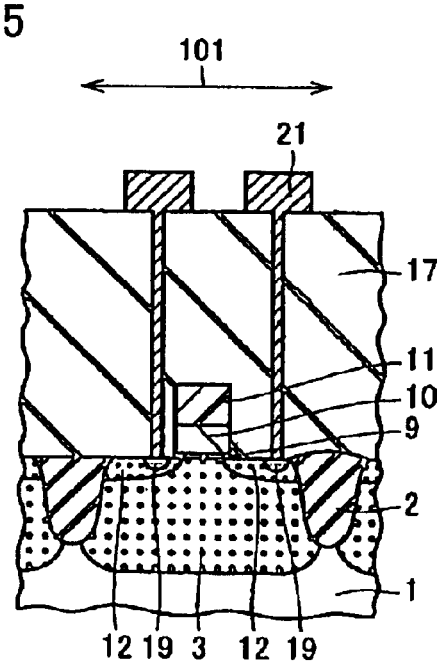
FIG. 5 illustrates the thirteenth step of the method of manufacturing the nonvolatile semiconductor memory device according to the second embodiment of the present invention.
Figures 10A, 10B, 10C, 10D:
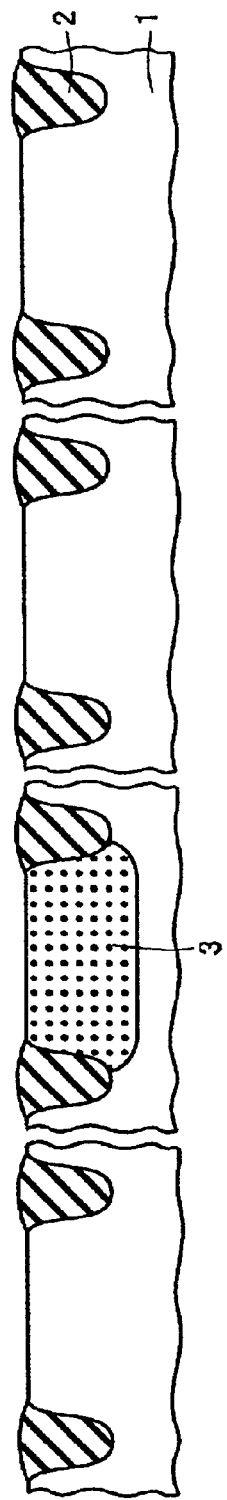
Figures 12A, 12B, 12C, 12D:
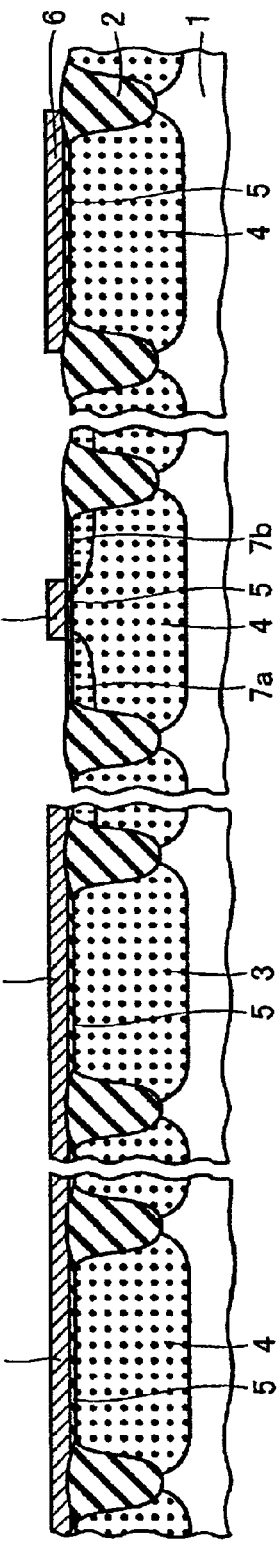
Figures 13A, 13B, 13C, 13D:
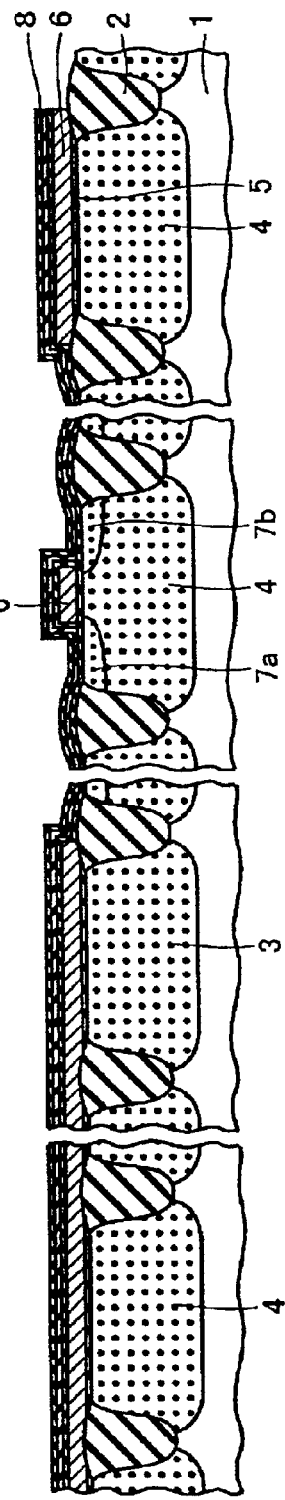
Figures 14A, 14B, 14C, 14D:
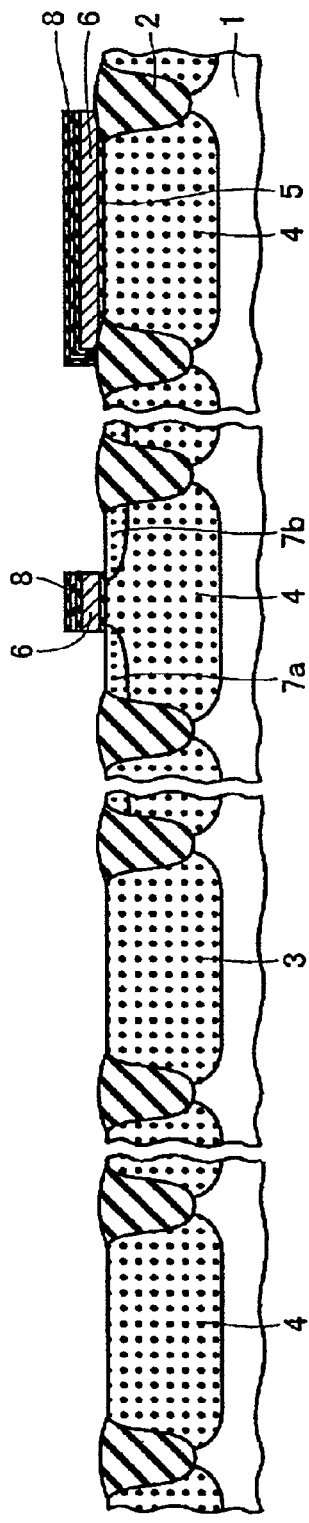
Figures 18A, 18B, 18C, 18D:
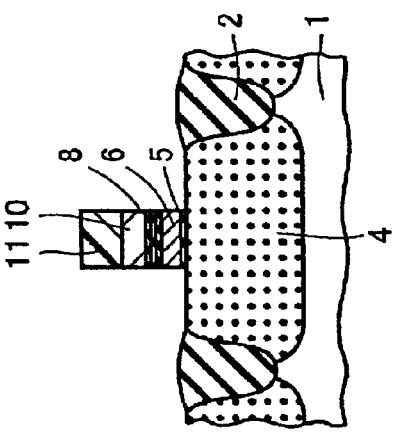

A method of manufacturing a nonvolatile semiconductor memory device according to a second embodiment of the present invention is described in conjunction with FIGS. 4 and 5. This manufacturing method is basically the same as that of the nonvolatile semiconductor memory device discussed above in connection with the first embodiment. A difference therebetween is in the arrangement of contact holes 20. Specifically, according to the first embodiment, contact holes 20 in each transistor are bilaterally symmetrical, and gate-contact distances A and B of the high breakdown-voltage transistor and high drive-power transistor respectively are different. According to the second embodiment, the high breakdown-voltage transistor is classified into two transistor types. Specifically, one type of the high breakdown-voltage transistor has its source and drain sides which may be replaced with each other and thus used as drain and source sides respectively, and the other type thereof has its source and drain sides which are never replaced with each other. In the former type of the transistor, contact holes 20 are bilaterally symmetrically arranged with distance A as described in connection with the first embodiment. In the latter type of the transistor, contact holes 20 are arranged bilaterally asymmetrically as shown in FIG. 4. Here, the distance between the gate electrode and contact hole 20 on the drain side is denoted by A while the distance between the gate electrode and contact hole 20 on the source side is denoted by B. After contact holes 20 are produced, a contact-connected p-type diffusion layer 19 and a contact-connected n-type diffusion layer 18 are formed by the same method as that of the first embodiment. Moreover, an Al—Si—Cu interconnect 21 is formed by the same method as that of the first embodiment. Accordingly, the structure shown in FIG. 5 is produced in the high breakdown-voltage transistor region where the source and drain sides are not replaced with each other.

The nonvolatile semiconductor memory device manufactured as discussed above is structured as described in connection with the first embodiment and further structured, in the high breakdown-voltage transistor having its source and drain sides never replaced with each other, to have a longer width of low-concentration diffusion layer between the gate electrode and contact hole 20 on the drain side.

In the nonvolatile semiconductor memory device, the high breakdown-voltage transistor with its source and drain sides never replaced with each other has a greater width of low-concentration diffusion layer between the gate electrode and contact hole 20 on the drain side. Accordingly, a high breakdown-voltage is achieved therebetween. In this high breakdown-voltage transistor, the width of low-concentration diffusion layer between the gate electrode and contact hole 20 on the source side is smaller. Then, a high drive-power is achieved therebetween. In actual, only the region between the gate electrode and drain side requires a high breakdown-voltage while such a high breakdown-voltage is unnecessary in the region between the gate electrode and source side. Therefore, the transistor is structured asymmetrically so that the high breakdown-voltage is achieved only in the region requiring it. This structure thus has no needless high breakdown-voltage as compared with the structure where the gate-contact distance is made longer for both of the regions between the gate electrode and source-side and drain-side contact holes respectively.

Here, gate-contact distance A in the high breakdown-voltage transistor having bilaterally asymmetrically arranged contact holes may be A' which is shorter than gate-contact distance A in the high breakdown-voltage transistor having bilaterally symmetrically arranged contact holes. In addition, gate-contact distance B in the high breakdown-voltage transistor having bilaterally asymmetrically arranged contact holes may be B' shorter than gate-contact distance B in the high breakdown-voltage transistor having bilaterally symmetrically arranged contact holes.

Third Embodiment

A method of manufacturing a nonvolatile semiconductor memory device according to a third embodiment of the present invention is described in conjunction with FIGS. 6A–6D, 7A–7D and 8A–8D. Here, similarly to the first embodiment, a high breakdown-voltage PMOS transistor region 101, a high drive-power PMOS transistor region 102, a high breakdown-voltage NMOS transistor region 201 and a high drive-power NMOS transistor region 202 are shown side by side in order respectively in FIGS. 6A–6D (7A–7D, 8A–8D).

Referring to FIGS. 6A–6D, according to this manufacturing method, a sidewall 14 is formed in each of high drive-power PMOS transistor region 102 and high drive-power NMOS transistor region 202. Sidewall 14 is formed by depositing a silicon oxide film by CVD to a thickness of 1000 Å and anisotropically etching the silicon oxide film. Then, a resist is formed by photolithography to cover PMOS transistor region 100, memory cell region and high breakdown-voltage NMOS transistor region 201. The resist is used as a mask to implant arsenic ions under the conditions of 50 keV and $3 \times 10^{15}$ cm$^{-2}$. A high-concentration p-type diffusion layer 16 is thus formed. The resist is then removed. By photolithography again, a resist is formed to cover NMOS transistor region 200, memory cell region and high breakdown-voltage PMOS transistor region 101. The resist is used as a mask to implant $BF_2$ ions under the conditions of 30 keV and $3 \times 10^{15}$ cm$^{-2}$ and accordingly a high-concentration n-type diffusion layer 15 is formed. The resist is removed and the structure shown in FIGS. 6A–6D is completed. At this stage, the memory cell region has the structure shown in FIGS. 20C and 20D explained above in connection with the conventional art.

Referring to FIGS. 7A–7D, a boron-phosphorus glass 17 is deposited to a thickness of 10000 Å by CVD. By annealing in a nitrogen atmosphere at 850° C. for 30 minutes, the boron-phosphorus glass is hardened or annealed. After this, a resist is formed by photolithography into a desired pattern. The resist is used as a mask to etch the boron-phosphorus glass to produce contact holes 20 leading respectively to high-concentration p-type diffusion layer 16 and high-concentration n-type diffusion layer 15. Contact holes 20 are arranged as done for the conventional device with the uniform distance for both of the high breakdown-voltage and high drive-power transistors.

Referring to FIGS. 8A–8D, an Al—Si—Cu interconnect 21 is formed by the same method as that of the first embodiment. At this stage, the memory cell region has the structure shown in FIGS. 21C and 21D described in connection with the conventional art. The nonvolatile semiconductor memory device is completed in this way.

In the nonvolatile semiconductor memory device manufactured as described above, contact holes are arranged with the same pattern for both of the high breakdown-voltage transistor and high drive-power transistor. High breakdown-voltage transistor has no high-concentration diffusion layer while the high drive-power transistor includes sidewall 14 and the high-concentration diffusion layer formed by using sidewall 14.

As shown in FIG. 23, the drive current of a transistor and the width of low-concentration diffusion layer are closely related to each other. According to this embodiment, the high drive-power transistor includes the high-concentration diffusion layer and thus the remaining low-concentration diffusion layer has a decreased width. Specifically, the width of the remaining low-concentration diffusion layer depends on the width of the sidewall, and accordingly, the low-concentration diffusion layer of the high drive-power transistor can have a certain short width without any change to the arrangement of contact holes for placing the contact holes closer to the gate electrodes as done according to the first and second embodiments. In this way, the drive current of the high drive-power transistor can be prevented from decreasing and further, the drive current can be kept constant. On the other hand, the high breakdown-voltage transistor can have an enhanced breakdown-voltage property since the width of low-concentration diffusion layer can be increased by arranging contact holes distantly from the gate electrodes.

According to this embodiment, the contact holes are arranged with the same pattern for both of the high breakdown-voltage transistor and high drive-power transistor. However, the contact holes may be arranged like those of the second embodiment. Specifically, the high breakdown-voltage transistor is classified into the one having source and drain sides which may be replaced with each other and thus used as drain and source sides respectively and the one having source and drain sides which are not replaced for use. Then, for the former high breakdown-voltage transistor, contact holes 20 are arranged bilaterally symmetrically while contact holes 20 are arranged asymmetrically for the latter high breakdown-voltage transistor as shown in FIG. 4.

According to the present invention, in the high breakdown-voltage transistor region, the width of low-concentration diffusion layer formed of a first pair of diffusion layers is made greater so that the maximum field intensity $E_m$ can be decreased and thus the break-down voltage property can be enhanced. On the other hand, in the high drive-power transistor region, the width of low-concentration diffusion layer is smaller so that the drain current does not decrease and thus the operating speed can be kept high. These transistors of different types can be manufactured simultaneously in parallel without change to the conventional process steps.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
   a semiconductor substrate including a memory cell region and a peripheral circuitry region;
   a first transistor placed at said memory cell region and on said semiconductor substrate; and
   second and third transistors placed at said peripheral circuitry region and on said semiconductor substrate and formed in a well region of a first conductivity type,
   said first transistor serving as a nonvolatile memory device capable of writing, erasing and reading information by being applied with a predetermined voltage,
   said second and third transistors each including
      a gate electrode formed on a main surface of said semiconductor substrate,
      a first pair of diffusion layers formed in respective active regions adjacent to two lateral sides respectively of said gate electrode and having a first impurity concentration of impurities of a second conductivity type different from said first conductivity type,
      an interlayer insulating film formed to cover said gate electrode and said first pair of diffusion layers, and
      paired contacts electrically connected respectively to the diffusion layers of said first pair of diffusion layers through said interlayer insulating film,
   said paired contacts including respective contact bodies extending upward from said main surface and respective contact-connected diffusion layers locally having a second impurity concentration higher than said first impurity concentration in respective regions in the vicinity of respective contact regions between said contact bodies and said semiconductor substrate,
   said second and third transistors are identical in terms of the death of said first pair of diffusion layers from said main surface,
   said second and third transistors are identical in terms of the depth of said contact-connected diffusion layers from said main surface,
   said first pair of diffusion layers and said contact-connected diffusion layers of said third transistor are in direct contact with each other at said main surface,
   said second and third transistors are different from said first transistor in terms of the structure of the diffusion layers formed at said main surface with the sate electrode interposed between the paired diffusion layers,
   said second transistor being connected to an interconnection to which a voltage of at most a predetermined first level is applied,
   said third transistor being connected to an interconnection to which a voltage of a second level higher than said first level is applied,
   the distance between the contact body of said third transistor and the gate electrode thereof is longer than the distance between the contact body of said second transistor and the gate electrode thereof, and
   the distance between the contact-connected diffusion layer of said third transistor and the gate electrode thereof is longer than the contact-connected diffusion layer of said second transistor and the gate electrode thereof.

2. The nonvolatile semiconductor memory device according to claim 1, wherein
   said third transistor is structured in such a manner that said voltage of the second level is applied to only one of the contact bodies of said paired contacts, and the distance between said gate electrode and said contact body to which said voltage of the second level is applied is longer than the distance between said gate electrode and the contact body to which said voltage of the second level is not applied.

* * * * *